United States Patent [19]

Eranian et al.

[11] 4,277,554
[45] Jul. 7, 1981

[54] RESIN WITH A THIETANE RING, CROSSLINKABLE BY ELECTRON PHOTON IRRADIATION, AND PROCESS FOR USING SUCH A RESIN

[75] Inventors: Armand Eranian; Jean-Claude Dubois; André Couttet; Evelyne Datamanti, all of Paris, France

[73] Assignee: Thomson-CSF, Paris, France

[21] Appl. No.: 93,972

[22] Filed: Nov. 14, 1979

[30] Foreign Application Priority Data

Nov. 14, 1978 [FR] France .................... 78 32109

[51] Int. Cl.³ ............................... B05D 3/06
[52] U.S. Cl. ................... 430/270; 204/159.11; 204/159.14; 427/43.1; 427/44; 427/54.1; 430/280; 526/256
[58] Field of Search .............. 430/270, 280; 427/44, 427/43.1, 54.1; 526/256; 204/159.11, 159.14

[56] References Cited

U.S. PATENT DOCUMENTS

| | | | |
|---|---|---|---|
| 3,404,158 | 10/1968 | Yu | 526/256 |
| 3,519,598 | 7/1970 | Larsen | 526/256 |
| 3,835,003 | 9/1974 | Schlesinger | 430/280 |
| 4,058,400 | 11/1977 | Crivello | 204/159.11 |
| 4,081,276 | 3/1978 | Crivello | 430/270 |
| 4,161,405 | 7/1979 | Crivello | 430/280 |

FOREIGN PATENT DOCUMENTS 2722951 1/1977 Fed. Rep. of Germany ......... 526/256

*Primary Examiner*—John H. Newsome
*Attorney, Agent, or Firm*—Oblon, Fisher, Spivak, McClelland & Maier

[57] ABSTRACT

A resin crosslinkable by electron or photon irradiation (gamma rays, X-rays or ultraviolet rays), which is (after crosslinking) very stable under the action of ambient light and heat. It contains a substance the chemical formula of which comprises a thietane ring:

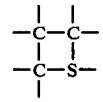

notably a compound of the methacrylic ester polymer type wherein the monomer has the general formula:

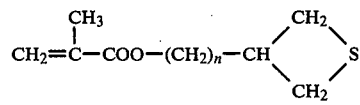

wherein n may be zero or equal to an integer from 1 to 10. The process for using such a resin consists of dissolving it in a solvent, then applying a thin layer of the solution on the object to be coated and finally treating the coating by irradiation.

15 Claims, No Drawings

RESIN WITH A THIETANE RING, CROSSLINKABLE BY ELECTRON PHOTON IRRADIATION, AND PROCESS FOR USING SUCH A RESIN

BACKGROUND OF THE INVENTION

The invention relates to resin with a thietane ring crosslinkable by electron or photon irradiation (gamma rays, X-rays or ultraviolet rays). The synthesis of this resin and the use thereof are part of the invention.

The phenomenon of the cross-linking of resins known as negative resins is known, which harden under the effect of irradiation by the setting up of "bridging" bonds between the different chains of polymers which they contain, these bonds resulting in the formation of a three-dimensional network. From the point of view of the intrinsic properties of the resins, this is manifested by an increase in their molecular mass which is the reason for their insolubility in developing solvents.

Of the most sensitive negative resins, families of compounds are known which are crosslinkable by electron and photon irradiation, comprising at least one substance the chemical formula of which contains a thiirane ring:

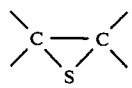

These compounds are about ten times more sensitive than epoxy resins but have the defect of being unstable, particularly under the effect of light and heat.

The invention sets out to remedy this disadvantage.

BRIEF SUMMARY OF THE INVENTION

The resin according to the invention comprises at least one substance the chemical formula of which contains a thietane ring:

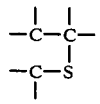

In one embodiment of the invention, this substance is a copolymer of a first monomer, of the methacrylic ester type containing the thietane ring, of general formula (1):

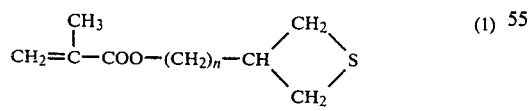

wherein n is equal to zero or an integer from 1 to 10 and a second monomer of general formula (2):

where R is hydrogen or an alkyl group with m carbon atoms (m being an integer from 1 to 10) and R' is an alkyl group or a group containing at least one epoxy, oxetane or thiirane ring.

The second monomers which can be used include methyl methacrylate, glycidyl methacrylate, 2,3-epithio-propyl methacrylate, butyl methacrylate and ethyl acrylate.

The invention is explained more fully in the following description containing in particular the general method of synthesis of resins according to the invention, examples of methods and details of the methods of use.

GENERAL METHOD OF SYNTHESIS (1) Synthesis of the "thietane" alcohol of general formula (3):

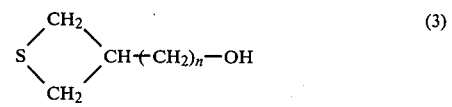

where n is either zero or an integer from 1 to 10, is carried out as follows:

(a) when n=0, by reacting hydrogen sulphide with epichlorohydrin in an alkaline medium, effected with the aid of barium oxide, for example;

(b) if n is other than zero, by the action of potassium thiocyanate on the 1,3-dioxane-2-one-5-ols corresponding to the value of n.

(2) The methacrylic ester of general formula (1) is obtained by the acylation of the thietane alcohol of formula (3) with methacrylic chloride. The reaction is carried out at ambient temperature in the presence of dimethylaniline which acts as solvent and as a trap for retaining the hydrochloric acid formed during the reaction.

(3) The preparation of a copolymer is carried out by mixing the monomers of formula (1) and (2) in a solvent which is, for example, benzene, then adding a radical polymerisation catalyst such as α,α'-azobisisobutyronitrile, for example. The mixture is then heated to 80° C. for several hours. After cooling, the copolymer is obtained by precipitation with a mixture of methanol and hexane, then dried in vacuo.

(4) To photosensitise the copolymer to ultraviolet radiation, at least one of the following three salts may be added:

- an aryldiazonium salt of general formula:

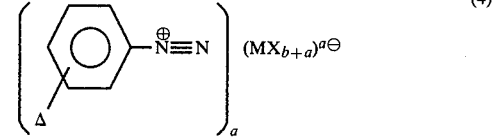

-an aryliodonium salt:

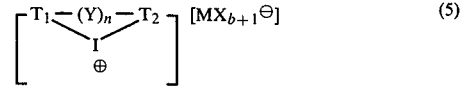

with n=0 or 1

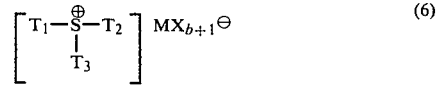

The photolysis of these salts produces cationic crosslinking initiators.

In these formulae,
the substituent Δ denotes a radical or a plurality of radicals such as:

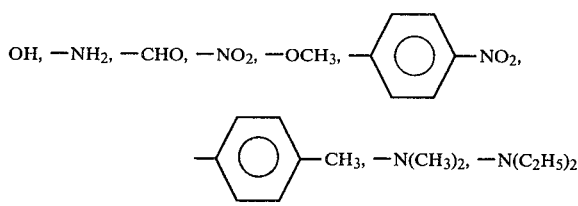

the letters a and b denote integers from 1 to 5
the element M is a metal such as Fe, Sn, Sb or Bi or another element such as B, P, As X denotes a halogen such as F or Cl $T_1$, $T_2$, $T_3$ denote aromatic radicals (which may be identical) comprising 4 to 20 carbon atoms (phenyl, thienyl, furanyl, pyrazolyl)

Y denotes a radical such as:

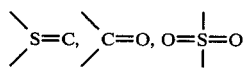

$R_3$-N (with $R_3$=H or an alkyl, or an acyl or a C—C bond);

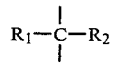

(with $R_1$ and $R_2$ denoting identical or different radicals such as H or an alkyl with 1 to 4 carbon atoms, or an alkenyl with 2 to 4 carbon atoms.

EXAMPLE OF METHOD

This example relates to the synthesis of 3-thietanyl methacrylate of formula (1) with n=0 and to the copolymerisation of this monomer with methyl methacrylate in a relative molar proportion of 50%.

As 3-thietanyl methacrylate is synthesised from 3-thietanol, the latter was first prepared by reacting hydrogen sulphide with epichlorohydrin in an alkaline medium, according to the following method:

157.5 g of hydrated barium oxide (0.5 mole) are placed in suspension in demineralised water (0.9 liter). The solution is stirred and saturated with hydrogen sulphide. Whilst the introduction of $H_2S$ is continued, the reaction mixture is cooled by a mixture of acetone and dry ice, then 46.26 g of epichlorohydrin (0.5 mole) are poured in. During this pouring (90 minutes), the temperature is maintained at between 0° and 5° C. When it is complete, the introduction of $H_2S$ is stopped. The reaction mixture is then heated to 50°-55° C. for an hour. After cooling to ambient temperature, the barium is precipitated in the form of the carbonate by the addition of carbon dioxide gas. The barium carbonate is then separated off by filtration. The filter product is washed with demineralised water. The organic phase is then extracted with ether from the mother solution and from the washing water and then it, too, is washed with demineralised water until neutral. It is then dried on sodium sulphate. After the ether has been eliminated and the remaining product has been distilled, 19.5 g of 3-thietanol are obtained. Distillation is carried out at 94° to 97° C. under 27 mmHg.

The 3-thietanyl methacrylate is then synthesised by acylating the 3-thietanol with methacryloyl chloride.

22.99 g of methacryloyl chloride (0.22 mole) are slowly poured (20 mins), with stirring, into a solution of 18 g of 3-thietanol (0.2 mole) in dimethylaniline (80 g, i.e. 0.66 mole). Stirring is then continued at ambient temperature for 8 days. After this time, the reaction mixture is poured on to the following mixture: 270 g of ice—27 cm³ (47.5 g) of concentrated sulphuric acid. The solution is stirred for 2 hours, then the organic phase is extracted with ether. It is then washed with demineralised water until neutral and dried over sodium sulphate. The ether is eliminated and then the remaining product is distilled in the presence of hydroquinone. The distillation temperature is 44° C. under a pressure of 0.1 mm of Hg. 8.5 g of 3-thietanyl methacrylate are obtained.

The copolymer of 3-thietanyl methacrylate and methyl methacrylate (in a molar ratio of 50%) is synthesised as follows:

0.004 g of α,α'-azobisisobutyronitrile are dissolved in a solution containing 2.3 g (0.015 moles) of 3-thietanyl methacrylate and 2.9 g (0.029 moles) of methyl methacrylate, previously distilled in 14.5 cm³ of benzene. The solution is heated to the reflux temperature of the reaction mixture for three and a half hours. After cooling, it is poured into a mixture of methanol (76 cm³) and hexane (25 cm³): the copolymer is precipitated. The precipitate is then washed with methanol and dried in vacuo. 4.7 g of dry product are obtained. Measurement of the sulphur, carried out by elementary analysis, gave the following result: 8.84 to 9.09% for 8.94% calculated.

Process for using the resin and examples of use

In the following, the resin according to the invention will be referred to as "thietane resin".

Two chief examples of use can be cited.

The first of these is the production of masks "in situ" in the course of the stages of the production of electronic components. This is microlithography used particularly in the production of integrated circuits.

The second example is the treatment of various objects in order to cover them with a protective layer; this applies to the sheaths of electric cables and cabinet-making.

In both cases, a solution of thietane resin in a solvent such as 4-methyl-2-pentanone is first prepared.

In the first case, the solution is deposited on a substrate or on a plate containing one or more integrated circuits in the process of manufacture, using a centrifugation device. Depending on the speed of rotation of the substrate, a coating of variable thickness, e.g. from 0.5 to 1 micron, is obtained.

In the second case, the same procedure is used, either by soaking or by spraying. The coating is generally thicker if the two latter processes are used, which is preferable in order to obtain effective protection.

In both cases, the solvent is then evaporated from the resin by subjecting the resin-coated substrate to thermal treatment, e.g. by keeping it in an oven at 180° C. for half an hour.

The layer of resin is then irradiated. The method is selected according to a number of factors: the dimensions of the object which is to be irradiated, the thickness of the layer of resin, the irradiation time chosen in accordance with industrial constraints.

(1) If electron irradiation has been chosen, a beam of accelerated electrons at 20 kV may be used, for example, and the resin coating may be swept with the beam. In the case of microlithography, the mask is traced by programming the sweeping using the now conventional electronic masking process.

This sweeping is continued until a 70% crosslinking of the resin coating is obtained.

(2) If irradiation with ultraviolet rays is selected, it is possible to use either "distant" radiation ($200 < \lambda < 300$ nm) or "close" radiation ($\lambda > 300$ nm). In the latter case, one of the photosensitisers described above must be added.

The ultraviolet sources which can be used include deuterium lamps, mercury vapour lamps and organic molecule lasers.

(3) X-ray radiation may also be used, particularly soft X-ray radiation obtained either from synchrotron radiation emitted in a storage ring (continuous spectrum) or from the characteristic emission of certain elements, resulting from the bombardment of a target consisting of these elements with electrons (characteristic lines). The wavelengths which can be used in this case are: 4.6 Å (line $L_{\alpha 1,2}$ of Rh); 5.41 Å (line $L_{\alpha 1,2}$ of Mo); 8.34 Å (line $K_{\alpha 1,2}$ of Al); 13.1 Å (line $L_{\alpha 1,2}$ of Cu); 44.7 Å (line $K_\alpha$ of C).

(4) Finally, gamma radiation may be used, emitted for example by conventional sources such as:

$_{55}^{137}$Cs ($E_\gamma = 0.662$ MeV) or $_{27}^{60}$Co ($E_{\gamma 1} = 1.17$ MeV, $E_{\gamma 2} = 1.33$ MeV).

The use of ultraviolet rays is perfectly suitable for the crosslinking of thin films of these resins. For thick layers, the use of electron beams or ionising radiation ($\gamma$, X) is desirable, as they penetrate better.

In the case of microlithography, except for the electronic masking the irradiation is effected through a mask applied to the object which is to be treated and capable of stopping the radiation.

Finally, when the resin is to be developed, the zones of non-irradiated resin are dissolved using a ketone, such as 4-methyl-2-pentanone.

As an example of the use of the resin according to the invention, the following is the method used for microlithography on a silicon substrate covered with $SiO_2$ for the collective production of semiconductor circuits.

The resin chosen in this case consists of a copolymer of 3-thietanyl methacrylate and methyl methacrylate, and the coating is applied by centrifuging and irradiated by X-rays.

First, the copolymer is dissolved in 4-methyl-2-pentanone to obtain a 10% by weight solution of the copolymer.

Centrifugation at a rotation speed of 5000 r.p.m. gives a layer 0.5 to 1 micron thick.

The residual solvent is eliminated by thermal treatment at 180° C. for half an hour.

After a mask has been applied to the sample which is to be irradiated, the irradiation is carried out using X-rays with a wavelength of 8.34 angstroms (obtained with an aluminium anticathode). Irradiation lasts for several tens of minutes.

Development is effected by submerging the sample in a mixture consisting of 1.5 parts by volume of 4-methyl-2-pentanone and 1 part of methanol for 1 minute at 30° C.

The invention is not limited to the embodiments described and represented and various modifications can be made thereto without passing beyond the scope of the invention.

What is claimed is:

1. A resin crosslinkable by electron or photon irradiation, comprising at least one substance the chemical formula of which contains a thietane ring:

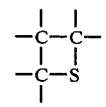

2. A resin according to claim 1, wherein the said substance is a polymer of a methacrylic ester of formula:

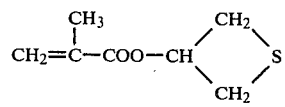

3. A resin according to claim 1, wherein the said substance is a polymer of a methacrylic ester of general formula:

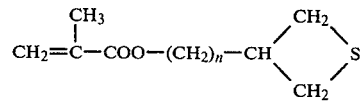

where n is an integer from 1 to 10.

4. A resin according to claim 1, wherein it is a copolymer of a first monomer containing the thietane ring and a second monomer of general formula:

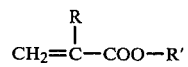

where R represents either hydrogen or an alkyl group with m carbon atoms (m being an integer from 1 to 10) and where R' represents either an alkyl group or a group containing at least one epoxy, oxetane or thiirane ring.

5. A resin according to claim 4, wherein the second monomer is methyl methacrylate.

6. A resin according to claim 4, wherein the second monomer is glycidyl methacrylate.

7. A resin according to claim 4, wherein the second monomer is 2,3-epithio-propyl methacrylate.

8. A resin according to claim 4, wherein the second monomer is butyl methacrylate.

9. A resin according to claim 4, wherein the second monomer is ethyl acrylate.

10. A resin according to claim 1, containing a photosensitising agent.

11. A resin according to claim 10, wherein the photosensitiser is an aryldiazonium salt of general formula:

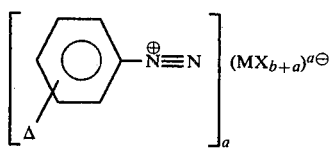 (5)

wherein a and b denote integers from 1 to 5, and Δ denotes a radical or a plurality of radicals belonging to the following group:

$-OH; -NH_2; -N(CH_3)_2; -N(C_2H_5)_2; -CHO; -OCH_3;$

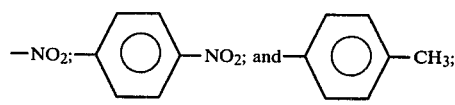

M denoting an element belonging to the following group of elements: Fe, Sn, Sb, Bi, B, P, As; and X denoting a halogen such as F or Cl.

12. A resin according to claim 10, wherein the photosensitiser is an aryliodonium salt of general formula:

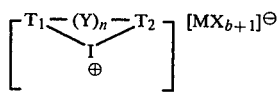

(where n=0 or 1) or a triarylsulphonium salt:

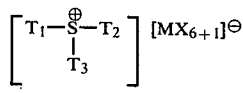

with the following conventions:

$T_1$, $T_2$ and $T_3$ denote aromatic radicals, which may be identical, comprising from 4 to 20 carbon atoms, such as phenyl, thienyl, furanyl and pyrazolyl;

Y denotes a radical such as:

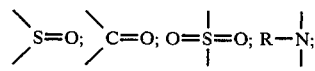

where R is a hydrogen atom or an alkyl or an acyl, or a C—C bond;

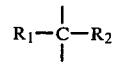

where $R_1$ and $R_2$ denote radicals, which may be identical, such as H or an alkyl with 1 to 4 carbon atoms, or an alkenyl with 2 to 4 carbon atoms;

M denotes one of the following elements: Fe, Sn, Sb, Bi, B, P, As;

X denotes a halogen such as F or Cl;

b denotes an integer from 1 to 5.

13. Process for using a resin according to claim 1, for the purpose of forming a mask intended for the production of electronic components, comprising at least the following steps:
  (a) dissolving the resin in a predetermined quantity of solvent;
  (b) applying the solution thus obtained in a thin layer over a predetermined part of an electronic component substrate;
  (c) treating predetermined portions of said substrate by irradiation.

14. Process for using a resin according to claim 1, for the purpose of forming a protective layer against atmospheric agents on an industrial object, comprising at least the following steps:
  (a) dissolving the resin in a predetermined quantity of solvent;
  (b) applying a thin layer of the solution thus obtained to the object to be protected, by soaking or spraying;
  (c) treating the protective layer by irradiation.

15. Process according to claim 13, wherein the solvent used in step (a) is 4-methyl-2-pentanone.

* * * * *

UNITED STATES PATENT AND TRADEMARK OFFICE
CERTIFICATE OF CORRECTION

PATENT NO. : 4,277,554
DATED : July 7, 1981
INVENTOR(S) : ARMAND ERANIAN ET AL

It is certified that error appears in the above-identified patent and that said Letters Patent are hereby corrected as shown below:

In The Abstract: Cancel the dash on the right of S in the first formula.

In Column 1, line 45: Add a dash between two carbon atoms.

In Column 3, lines 25-30: Cancel S=C and substitute therefor S=O.

Signed and Sealed this

Thirtieth Day of March 1982

[SEAL]

Attest:

Attesting Officer

GERALD J. MOSSINGHOFF
Commissioner of Patents and Trademarks